United States Patent
Scollo et al.

(10) Patent No.: US 7,023,246 B2
(45) Date of Patent: Apr. 4, 2006

(54) DRIVING CIRCUIT FOR A CONTROL TERMINAL OF A BIPOLAR TRANSISTOR IN AN EMITTER-SWITCHING CONFIGURATION HAVING A RESONANT LOAD

(75) Inventors: Rosario Scollo, Misterbianco (IT); Simone Buonomo, Augusta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 54 days.

(21) Appl. No.: 10/795,080

(22) Filed: Mar. 5, 2004

(65) Prior Publication Data
US 2004/0222839 A1 Nov. 11, 2004

(51) Int. Cl.
*H03K 3/00* (2006.01)
(52) U.S. Cl. ............................ 327/108; 327/478
(58) Field of Classification Search ........ 327/108–112, 327/478, 482–489; 326/82, 84, 89–92
See application file for complete search history.

(56) References Cited

U.S. PATENT DOCUMENTS

| | | | |
|---|---|---|---|
| 4,430,608 A | * | 2/1984 | Nesler .................. 323/282 |
| 4,695,770 A | | 9/1987 | Raets .................... 315/207 |
| 6,154,069 A | * | 11/2000 | Ebihara ................. 327/112 |

* cited by examiner

*Primary Examiner*—Kenneth B. Wells
(74) *Attorney, Agent, or Firm*—Lisa K. Jorgenson; Allen, Dyer, Doppelt, Milbrath & Gilchrist, P.A.

(57) ABSTRACT

A driving circuit is provided for a control terminal of a bipolar transistor in an emitter-switching configuration. The emitter-switching configuration is between a resonant load and a voltage reference. The driving circuit includes at least one capacitor between the control terminal of the bipolar transistor and the voltage reference. The driving circuit further includes an additional resonance capacitor between a collector terminal of the bipolar transistor and a circuit node, a first diode between the circuit node and the control terminal, and a second diode between the circuit node and the voltage reference.

25 Claims, 5 Drawing Sheets

DRIVING CIRCUIT FOR A CONTROL TERMINAL OF A BIPOLAR TRANSISTOR IN AN EMITTER-SWITCHING CONFIGURATION HAVING A RESONANT LOAD

FIELD OF THE INVENTION

The present invention relates to a driving circuit for a control terminal of a bipolar transistor in an emitter-switching configuration with a resonant load, and to a corresponding method for driving the same.

BACKGROUND OF THE INVENTION

An emitter-switching circuit configuration comprises a bipolar transistor having a high breakdown voltage connected to a low voltage power MOSFET transistor. Such a configuration is schematically shown in FIG. 1 and is indicated with reference numeral 1. The emitter-switching configuration 1 comprises a bipolar transistor T1 and a MOS transistor M1 cascode-connected together between a load 3 and a voltage reference, such as ground GND.

The emitter-switching configuration 1 provides that the bipolar transistor T1 is of the high voltage (HV) type, i.e., a high breakdown voltage transistor, while the MOS transistor M1 is of the low voltage (LV) type, i.e., a low breakdown voltage transistor. The bipolar transistor T1 has a collector terminal connected to the load 3, and a control terminal or base B1 connected to a driving circuit 2.

The load 3 is of the resonant or quasi-resonant type and comprises an inductor L1 corresponding to the primary of a transformer, and a capacitor C1 inserted in parallel with the inductor L1. The capacitor C1 is between the collector terminal of the bipolar transistor T1 and a supply circuit node X1. The supply node X1 is connected to a generator GB that provides a supply voltage Vcc, which is applied to the supply circuit node X1.

The capacitor C1 is chosen so that it resonates with the inductor L1 based upon the operating frequency of the intended application. The MOS transistor M1 has a control terminal or gate connected to the driving circuit 2.

The driving circuit 2 comprises a first resistive element R1 connected to the gate terminal G1 of the MOS transistor M1, and to ground GND via a voltage pulse generator GA. An electrolytic capacitor C2 is connected between the base terminal B1 of the bipolar transistor T1 and ground GND, and has across its terminals a voltage value equal to VB. A second inductor L2 corresponding to the secondary of a transformer is inserted between a second circuit node X2 and ground GND. A diode D1 is inserted between the base terminal B1 of the bipolar transistor T1 and the second circuit node X2.

The emitter-switching configuration is particularly interesting at the present time due to the marketing of bipolar transistors having a square RBSOA (Reverse Biased Safe Operating Area) with a current near the peak current. It also has a voltage equal to the breakdown voltage BVCES between the collector and emitter terminals when the base terminal is short-circuited with the emitter terminal (Breakdown Voltage Collector-Emitter Short), as well as of MOS power transistors having a very low drain-source resistance value in conduction conditions RDSON and thus being almost similar to ideal switches.

The main advantages of an emitter-switching configuration are an extremely low in-conduction voltage fall (typical of bipolar transistors) and a high turn-off speed, as readily known by those skilled in the art. When turning off, the current output from the bipolar transistor base terminal B1 is equal to the collector terminal current of this transistor, i.e., a very high value current. This causes a drastic reduction in both the storage time and the fall time, allowing the emitter-switching configuration to operate even at frequencies of 150 kHz.

All the applications satisfying the following relation will now be considered:

$$I_{BOFF} * t_{storage} >> I_{BON} * t_{ON}$$

Where:

$I_{BOFF}$ is the base current value of the bipolar transistor T1 in the turn-off step;

$t_{storage}$ is the storage time;

$I_{BON}$ is the base current value of the bipolar transistor T1 in the conduction step; and $T_{on}$ is the conduction time.

The above relation occurs when the operating frequency is relatively low (i.e., lower than 60 kHz), and particularly if high currents (higher than ten Amperes) are being dealt with. This is the case for rice cooker devices, for example, whose waveforms are indicated by way of example in FIG. 2 for an operating frequency of 35 kHz and with a highest collector current of about 40 A. In this case, the driving circuit of FIG. 1 is straightforward but expensive. In fact, it is necessary to provide a middle power supply (about 10 W).

Only the secondary part of the relevant power supply has been indicated in FIG. 1 for convenience of illustration. The power supply is essential since the base of the bipolar transistor T1 should be supplied with a current IB, which in the present application and in all similar applications, cannot be provided by recovering energy during the turn-off, as it happens instead in other applications.

For a better understanding of this concept it must be observed in FIG. 2 that the area A2, representing the amount of charge recovered during the turn-off, is far lower than the area A1 representing instead the amount of charge required by the base terminal B1 to make the switching configuration 1 operate correctly. This known approach is thus effective from a performance point of view, but is very expensive. Other known approaches provide for the use of IGBT or MOS power transistors.

When the following conditions occur: resonant or quasi-resonant load; high collector current (>10 A); relatively low frequency (<60 kHz); and not too low a duty cycle (>15%), the devices formed by IGBT power transistors are particularly suitable. In fact, in view of voltage levels, current values and the relatively low frequency, choosing a MOS power transistor (PowerMOS) would be particularly expensive.

A MOS power transistor able supporting voltages higher than 1000 V and conducting a high current would involve a silicon area from 5 to 10 times higher than an IGBT transistor or a bipolar transistor having the same breakdown voltage value and current capacity value. Moreover, a MOS power transistor would be unnecessary since its switching speed thereof, which is instead essential at higher frequencies, would not be fully exploited.

A bipolar transistor in the emitter-switching configuration has highly competitive turn-off times, and in particular, fall times comparable to those obtained with a MOS power transistor. It also has a very low in-conduction fall, the lowest obtainable with power devices, as illustrated in FIG. 4.

By using an IGBT transistor, a relatively low in-conduction voltage fall is similarly obtained, as indicated by the output features shown in FIG. 3. However, the IGBT transistor has a current queue when turning off, a phenomenon which can be completely deleted by using a bipolar transistor in the emitter-switching configuration (by conveniently driving the base terminal), as shown in FIG. 2. The use of a bipolar transistor in the emitter-switching configuration is thus limited with respect to the base terminal driving current.

SUMMARY OF THE INVENTION

An object of the present invention is to provide a driving circuit for a control terminal of a bipolar transistor in an emitter-switching configuration with a resonant load. The driving circuit has structural and functional characteristics for allowing the base current of the bipolar transistor to be correctly modulated, thus overcoming the limits and drawbacks still effecting configuration driving circuits for resonant applications according to the prior art.

This and other objects, advantages and features in accordance with the present invention are provided by exploiting the energy usually being transferred from the inductor to the resonance capacitor in the first part of the turn-off step when supplying the bipolar transistor base terminal.

One aspect of the present invention is directed to a driving circuit for a control terminal of a bipolar transistor in an emitter-switching configuration between a resonant load and a voltage reference, with the bipolar transistor comprising a control terminal and a collector terminal. The driving circuit comprises a capacitor connected between the control terminal of the bipolar transistor and the voltage reference, and an additional capacitor connected between the collector terminal of the bipolar transistor and a circuit node. A first diode may be connected between the circuit node and the control terminal of the bipolar transistor, and a second diode may be connected between the circuit node and the voltage reference.

Another aspect of the present invention is directed to a method for driving a control terminal of a bipolar transistor in an emitter-switching configuration between a resonant load and a voltage reference, with the bipolar transistor comprising a control terminal and a collector terminal. The method comprises applying a first voltage via at least one capacitor to the control terminal of the bipolar transistor, with the at least one capacitor being connected between the control terminal of the bipolar transistor and the voltage reference. The method may further comprise charging the at least one capacitor via a current flowing in an additional capacitor connected between the collector terminal of the bipolar transistor and a circuit node based upon a first diode connected between the additional capacitor and the capacitor. A discharge current of the additional capacitor is prevented from flowing in the capacitor based upon a second diode connected between the circuit node and the voltage reference.

BRIEF DESCRIPTION OF THE DRAWINGS

The features and advantages of the driving circuit and associated methods according to the invention will be apparent from the following description of an embodiment thereof given by way of a non-limiting example with reference to the attached drawings. In the drawings.

DETAILED DESCRIPTION OF THE PREFERRED EMBODIMENTS

Figure 5:
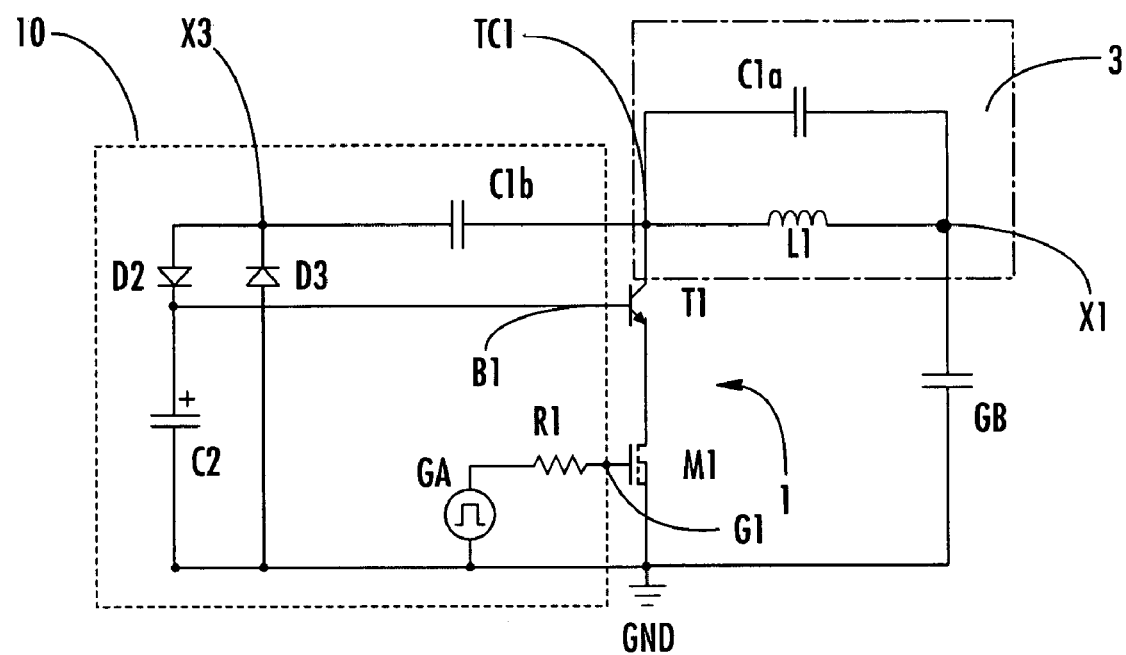
FIG. 5 schematically shows a driving circuit for a bipolar transistor in the emitter-switching configuration for resonant applications according to the present invention.

With reference to the figures, and particularly to FIG. 5, a driving circuit for an emitter-switching configuration with a resonant load according to the invention is schematically indicated with reference numeral 10. Elements that are structurally and functionally identical to those described with reference to FIG. 1 have been given the same reference numerals.

The driving circuit 10 is associated with an emitter-switching configuration 1 comprising a bipolar transistor T1 and a MOS transistor M1 cascode-connected to each other. The emitter-switching configuration 1 is connected between a load 3 and a voltage reference, such as ground GND.

As stated above, the emitter-switching configuration 1 provides that the bipolar transistor T1 is of the HV (High Voltage) type, i.e., a high breakdown voltage transistor, while the MOS transistor M1 is of the LV (Low Voltage) type, i.e., a low breakdown voltage transistor. The bipolar transistor T1 has a collector terminal connected to the load 3, and a control or base terminal B1 connected to the driving circuit 10.

The load 3 is of the resonant type, and comprises an inductor L1 corresponding to the primary of a transformer, and a first capacitor C1a. The first capacitor C1a is parallel with the inductor L1 between the collector terminal of the bipolar transistor T1 and a first circuit node X1. The first circuit node X1 is connected to a generator GB providing a supply voltage Vcc, which is applied to the supply circuit node X1. The MOS transistor M1 has a control or gate terminal connected to the driving circuit 10.

The driving circuit 10 comprises a first resistive element R1 connected to the gate terminal G1 of the MOS transistor M1. The first resistive element R1 is also connected to ground GND via a voltage pulse generator GA. An electrolytic capacitor C2 is connected between the base terminal B1 of the bipolar transistor T1 and ground GND, and across its terminals is a voltage equal to VB.

Advantageously according to the invention, the driving circuit 10 further comprises a capacitor C1b between the collector terminal TC1 of the bipolar transistor T1 and a second circuit node X3. First and second diodes D2, D3 are inserted between the second circuit node X3 and respectively, the base terminal B1 of the bipolar transistor T1 and ground GND.

The first diode D2 has a cathode terminal connected to the base terminal B1, and an anode terminal connected to the second circuit node X3. The second diode D3 has a cathode terminal connected to the second circuit node X3, and an anode terminal connected to ground GND.

Therefore, the driving circuit 10 advantageously exploits the energy transferred from the inductor L1 to the capacitor C1 in known devices in the first part of the turn-off step [OFF] in order to supply the base terminal B1 of the bipolar transistor T1.

Figure 1:
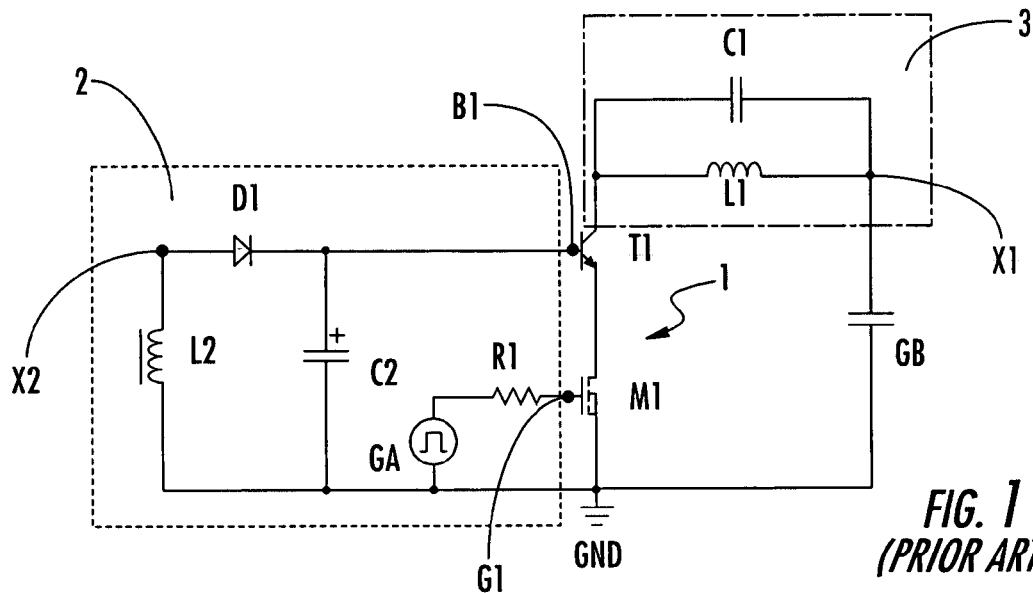
FIG. 1 schematically shows a driving circuit for an emitter-switching configuration for resonant applications according to the prior art.
Figure 2:
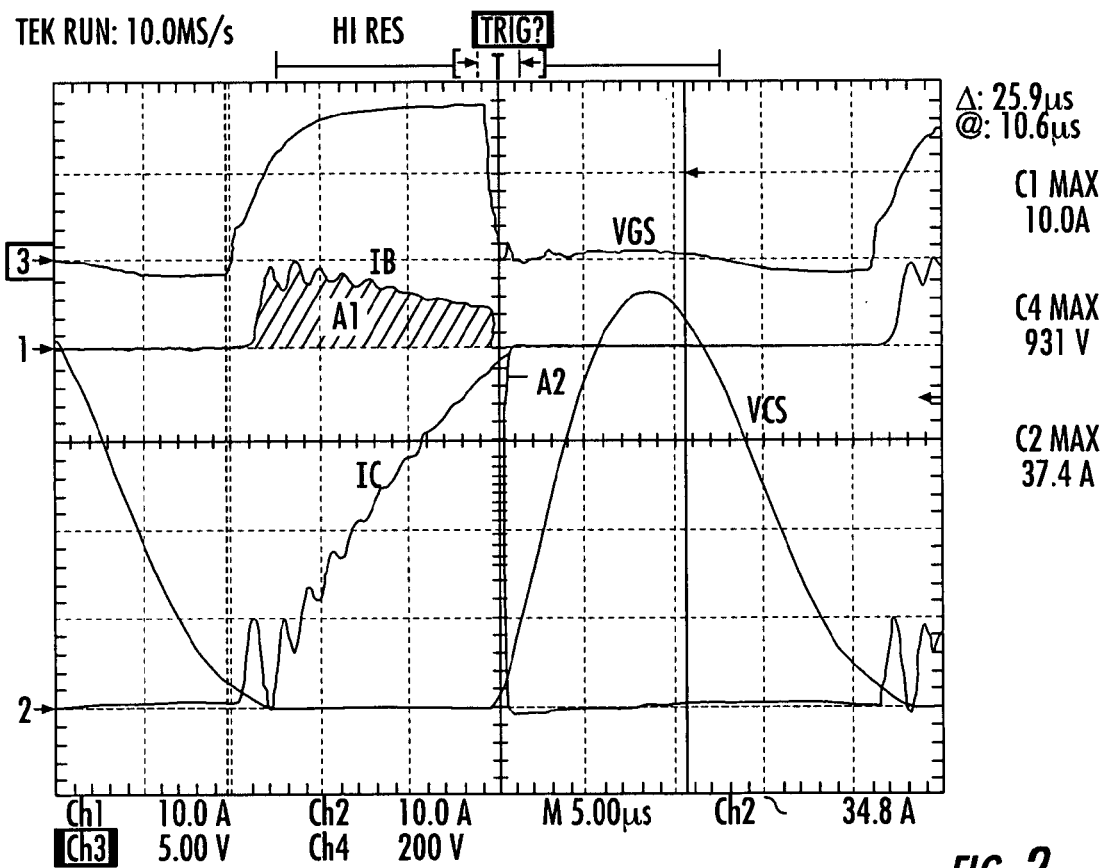
FIG. 2 schematically shows the waveforms typical of a rice cooker device according to the prior art.
Figure 3:
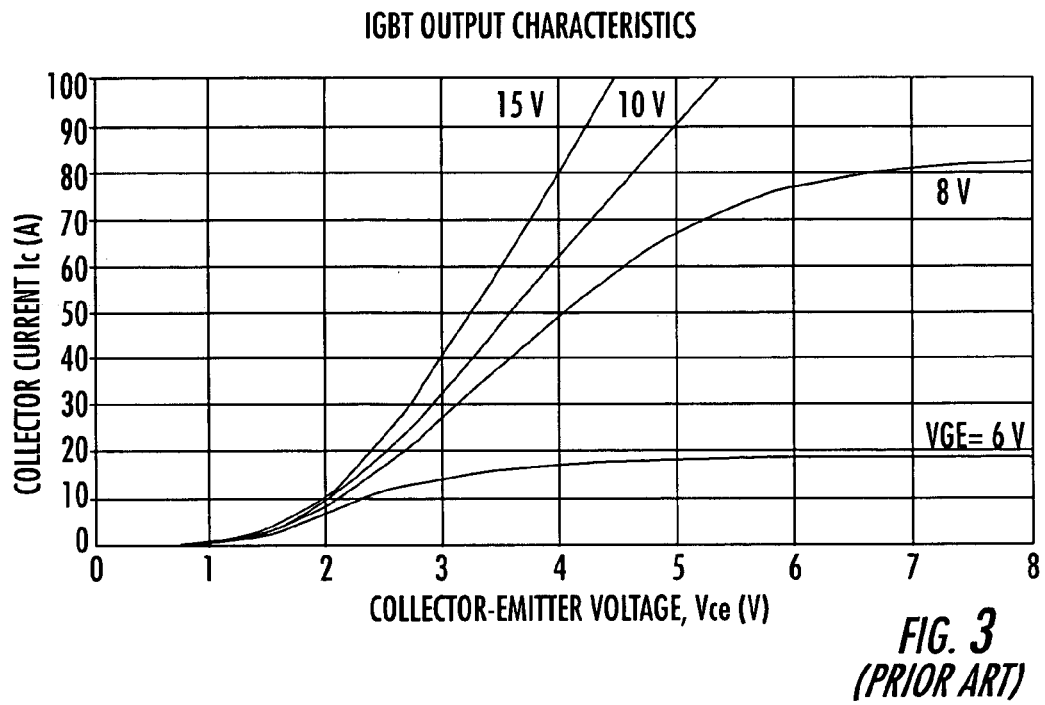
FIGS. 3 and 4 schematically show the output features of an IGBT transistor and an emitter-switching configuration according to the prior art.
Figure 4:
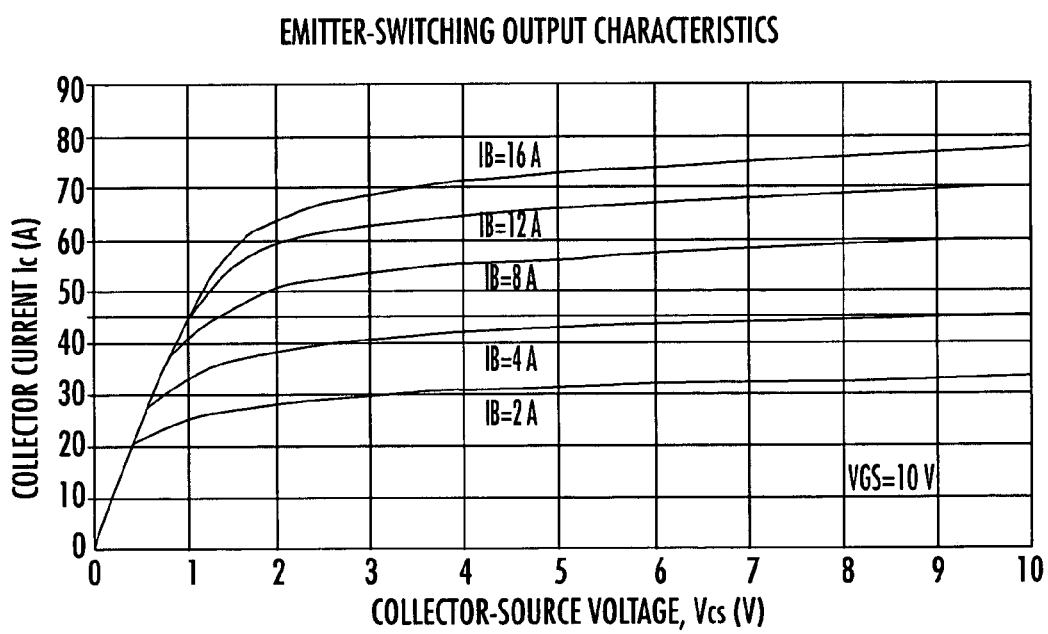

With reference to the circuit of FIG. 1, it is possible to connect the first capacitor C1 between the collector terminal TC1 of the bipolar transistor T1 and ground GND without making any changes concerning the system operation comprising the emitter-switching configuration 1 and the resonant load 3.

It must be also observed that a capacitor inserted between the collector terminal and ground GND is equal to a capacitor inserted between the collector terminal and the base terminal since the capacitor C2 is a high electrolytic capacitor with respect to capacitors C1a and C1b. Therefore, in the case shown in FIG. 5, the base terminal B1 can be considered as being connected to ground GND.

It is thus evident that capacitors C1a and C1b are in parallel and that they are chosen so that they correspond to the capacity value of the capacitor C1 of the resonant load 3 according to known approaches, such as the one shown in FIG. 1.

Advantageously according to the invention, dividing the prior art resonant capacitor C1 into capacitors C1a and C1b is used to conveniently supply the base terminal.

To achieve the correct operation of the bipolar transistor T1, the driving circuit 10 causes the current flowing in the capacitor C1b during the charge step to flow also in the electrolytic capacitor C2, while the opposite sign current, which discharges the capacitor C1b, does not discharge that electrolytic capacitor C2 due to the presence of diodes D2 and D3 being connected to the second circuit node X2 opposite to each other.

Always with reference to FIG. 5, it is possible to describe the driving method according to the invention.

Particularly, the method according to the invention allows the control terminal B1 of the bipolar transistor T1 in the emitter-switching configuration to be driven. The method provides the following steps of applying a first voltage value VB via a capacitor C2 to the control terminal B1; keeping the electrolytic capacitor C2 charged via a current flowing in the capacitor C1b due to the presence of diode D2; and preventing a capacitor C1b discharge current from flowing also in the electrolytic capacitor C2 due to the presence of diode D3.

Advantageously according to the invention, diodes D2 and D3 are chosen with a low breakdown voltage value (equal to about 20 V).

By way of example, in order to show the efficacy of the driving circuit according to the invention, a rice cooker device has been chosen with an operating frequency of 35 kHz and with a highest collector current reaching about 40 A, but the following considerations can be applied to any circuit having similar features to those indicated with reference to the prior art.

It is worth noting that in the system of FIG. 1 according to the prior art, during the discharge step [OFF], the magnetic energy stored during the conduction step [ON] in the inductor L1 is transferred to the capacitor C1 as electrostatic energy so that it can then be transferred again to the inductor L1.

Figure 6:
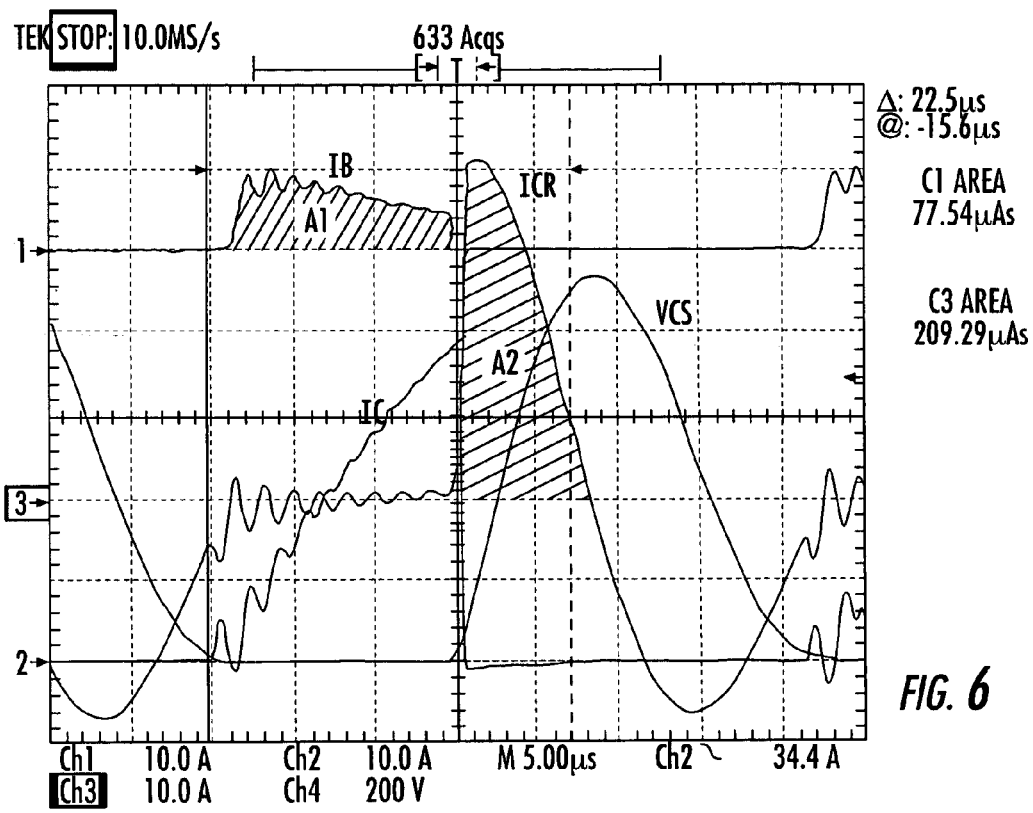
FIGS. 6 and 7 show the waveforms obtained with a known driving circuit according to the present invention.
Figure 7:
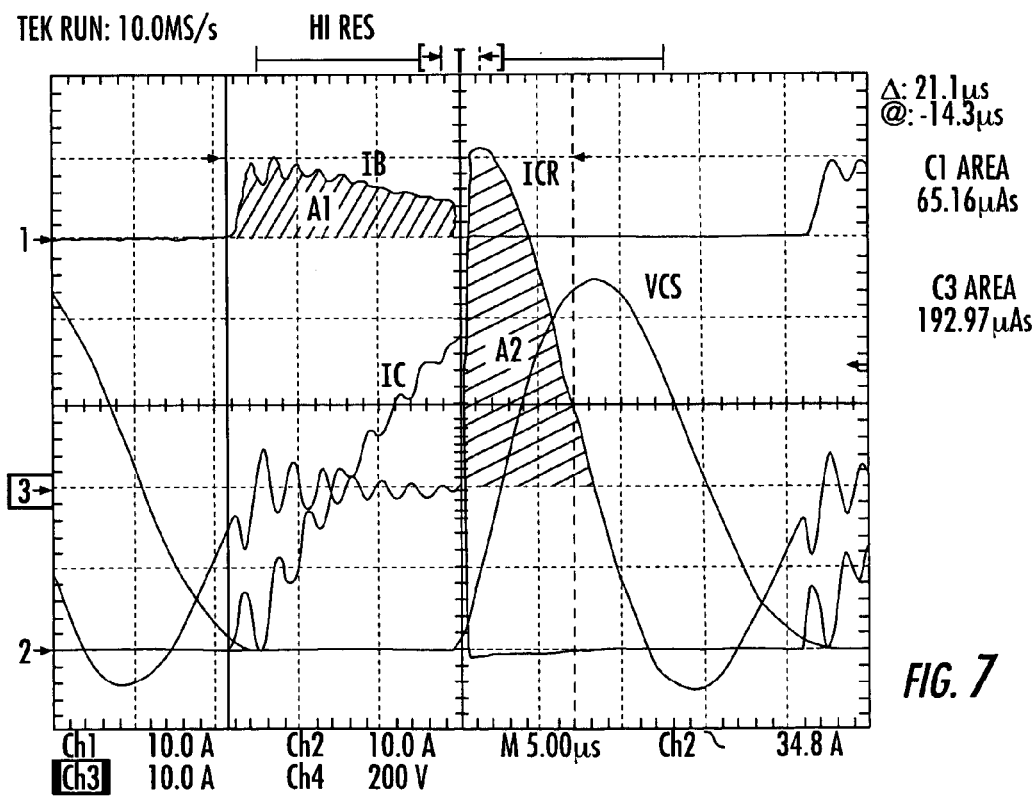

FIGS. 6 and 7 represent waveforms concerning a driving circuit according to the prior art in the case in which the capacitor C1 is in parallel with the inductor L1, or between the collector terminal and ground, respectively.

Particularly, it can be observed that the current flowing in the charge step on the capacitor C1 is the same in both cases.

It can also be noted in FIG. 6 that the charge serving to supply the base terminal B1 of the bipolar transistor T1 for each cycle during the conduction is in the range of 70 μC (area A1), while the amount of charge available is the one charging the capacitor C1 of FIG. 1 and it is equal to about 200 μC (area A2). In other words, the amount of charge required to supply the base terminal B1 is about a quarter of the total charge stored on the capacitor C1.

Advantageously according to the invention, the driving circuit 10 replaces the capacitor C1 with the parallel connection of two capacitors C1a and C1b, both being smaller than C1 and particularly the one having a value equal to a quarter of the other, so that the sum gives however the value of the capacitor C1 of the driving circuit according to the prior art. The capacitor C1b connected between the collector and base terminals will have to be the lower capacitor.

Figure 8:
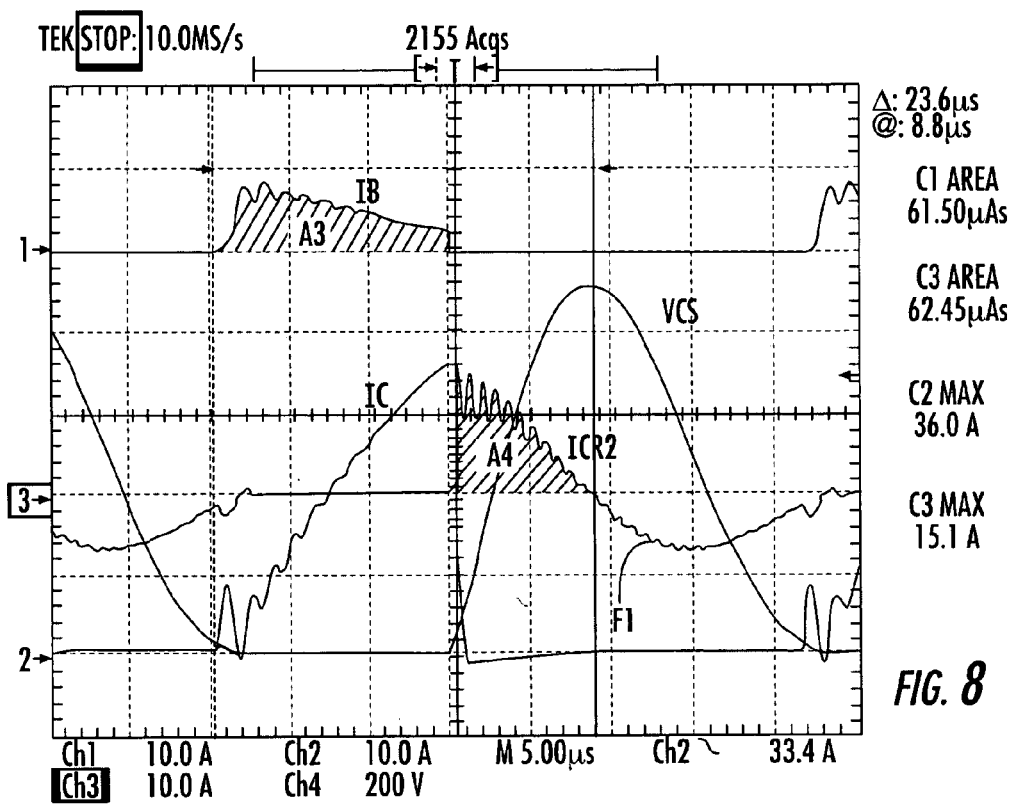
FIGS. 8 and 9 show the waveforms obtained by rice cooker devices using the driving circuit as shown in FIG. 5.
Figure 9:
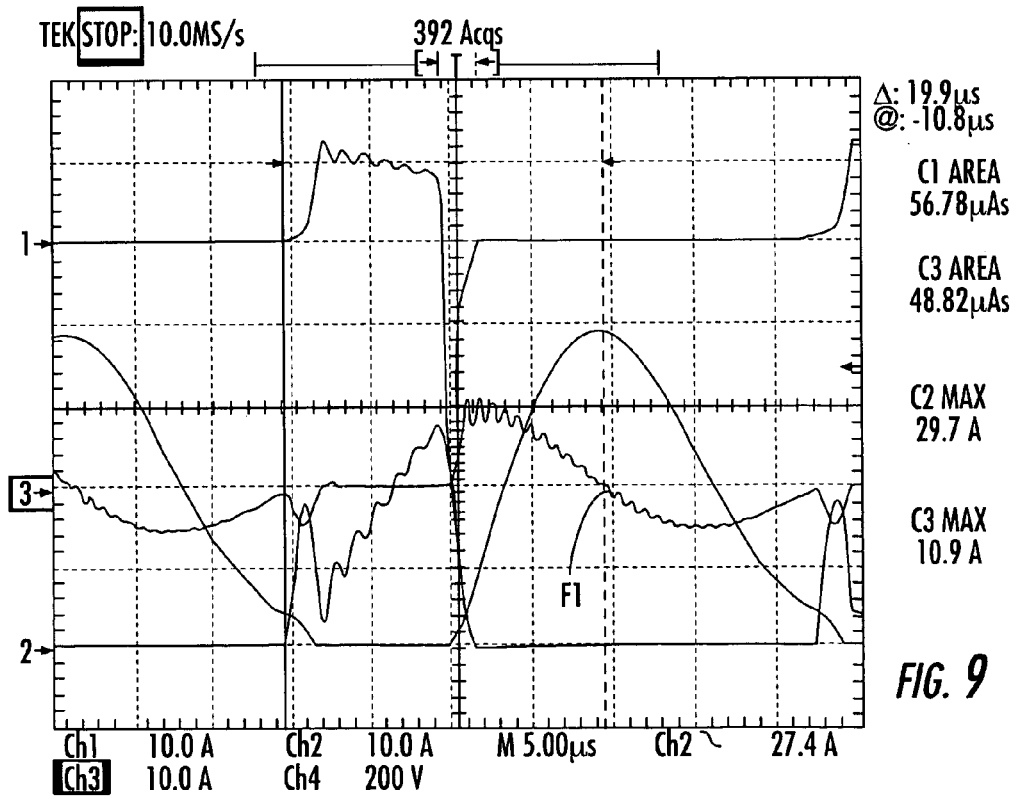

In this way, the situation of FIGS. 8 and 9 is achieved, wherein the curve F1 is the current flowing on the capacitor C1b, whose positive part charges the capacitor C2 and allows thus the base terminal B1 of the bipolar transistor T1 to be supplied. It is worth noting that, advantageously according to the invention, areas A3 and A4 are in this case identical, as underlined in FIG. 8.

Particularly, the driving circuit 10 according to the invention provides the base terminal B1 with an amount of charge being proportional to the highest current of the collector terminal TC1, as shown in FIGS. 8 and 9 for a driving circuit used in a rice cooker device.

In FIG. 8, for a high power rice cooker device, the highest collector current is equal to about 38 A and the charge stored on the electrolytic capacitor C2, and then used to drive the base terminal B1, is equal to 62 μC. In FIG. 8, for a low power rice cooker device, the highest collector current is equal to 30 A and the charge stored on the electrolytic capacitor C2 is equal to about 50 μC.

That which is claimed is:

1. A driving circuit for a control terminal of a bipolar transistor in an emitter-switching configuration between a resonant load and a voltage reference, the driving circuit comprising:
    a capacitor connected between a control terminal of the bipolar transistor and the voltage reference;
    an additional capacitor connected between a collector terminal of the bipolar transistor and a circuit node;
    a first diode connected between the circuit node and the control terminal of the bipolar transistor for charging the capacitor via a current flowing in the additional capacitor; and
    a second diode connected between the circuit node and the voltage reference for preventing a discharge current of the additional capacitor from flowing in the capacitor.

2. A driving circuit according to claim 1, wherein said first and second diodes are connected to the circuit node opposite to each other.

3. A driving circuit according to claim 1, wherein said first diode has a cathode terminal connected to the control terminal of the bipolar transistor, and an anode terminal connected to the circuit node.

4. A driving circuit according to claim 1, wherein said second diode has a cathode terminal connected to the circuit node, end an anode terminal connected to the voltage reference.

5. A driving circuit according to claim 1, wherein said first and second diodes each have a breakdown voltage equal to about 20 v.

6. A driving circuit according to claim 1, wherein the emitter-switching configuration further comprises a MOS transistor cascode-connected between an emitter terminal of the bipolar transistor and the voltage reference.

7. A driving circuit according to claim 1, wherein said capacitor comprises an electrolytic capacitor.

8. A circuit comprising:
a MOS transistor and a bipolar transistor cascode-connected therewith, said MOS transistor and said bipolar transistor to be connected between a resonant load and a voltage reference, and
a driving circuit for a control terminal of said bipolar transistor, and comprising
a capacitor connected between the control terminal of said bipolar transistor and the voltage reference,
an additional capacitor connected between a collector terminal of said bipolar transistor and a circuit node,
a first diode connected between the circuit node and the control terminal of said bipolar transistor, and
a second diode connected between the circuit node and the voltage reference.

9. A circuit according to claim 8, wherein said first and second diodes are connected to the circuit node opposite to each other.

10. A circuit according to claim 8, wherein said first diode has a cathode terminal connected to the control terminal of the bipolar transistor, and an anode terminal connected to the circuit node.

11. A circuit according to claim 8, wherein said second diode has a cathode terminal connected to the circuit node, and an anode terminal connected to the voltage reference.

12. A circuit according to claim 8, wherein said first and second diodes each have a breakdown voltage equal to about 20 v.

13. A circuit according to claim 8, wherein said capacitor comprises an electrolytic capacitor.

14. An apparatus comprising:
a resonant load;
a MOS transistor and a bipolar transistor cascode-connected therewith, said bipolar transistor connected to said resonant load and said MOS transistor connected to a voltage reference; and
a driving circuit for a control terminal of said bipolar transistor, said driving circuit comprising
a capacitor connected between the control terminal of said bipolar transistor and the voltage reference,
an additional capacitor connected between a collector terminal of said bipolar transistor and a circuit node,
a first diode connected between the circuit node and the control terminal of said bipolar transistor, and
a second diode connected between the circuit node and the voltage reference.

15. An apparatus according to claim 14, wherein said first and second diodes are connected to the circuit node opposite to each other.

16. An apparatus according to claim 14, wherein said first diode has a cathode terminal connected to the control terminal of the bipolar transistor, and an anode terminal connected to the circuit node.

17. An apparatus according to claim 14, wherein said second diode has a cathode terminal connected to the circuit node, and an anode terminal connected to the voltage reference.

18. An apparatus according to claim 14, wherein said first and second diodes each have a breakdown voltage equal to about 20 v.

19. An apparatus according to claim 14, wherein said capacitor comprises an electrolytic capacitor.

20. An apparatus according to claim 14, wherein said resonant load comprises:
an inductor; and
a load capacitor connected in parallel with said inductor.

21. A method for driving a control terminal of a bipolar transistor in an emitter-switching configuration between a resonant load and a voltage reference based upon a driving circuit, the driving circuit comprising a capacitor connected between a control terminal of the bipolar transistor and the voltage reference, an additional capacitor connected between a collector terminal of the bipolar transistor and a circuit node, a first diode connected between the circuit node and the control terminal of the bipolar transistor, and a second diode connected between the circuit node and the voltage reference, the method comprising:
applying a first voltage via the capacitor connected to the control terminal of the bipolar transistor;
charging the capacitor via a current flowing in the additional capacitor based upon the first diode connected between the additional capacitor and the capacitor; and
preventing a discharge current of the additional capacitor from flowing in the capacitor based upon the second diode connected between the circuit node and the voltage reference.

22. A method according to claim 21, wherein the first and second diodes are connected to the circuit node opposite to each other.

23. A method according to claim 21, wherein the first diode has a cathode terminal connected to the control terminal of the bipolar transistor and an anode terminal connected to the circuit node.

24. A method according to claim 21, wherein the second diode has a cathode terminal connected to the circuit node and an anode terminal connected to the voltage reference.

25. A method according to claim 21, wherein the first and second diodes have a breakdown voltage value equal to about 20 v.

* * * * *

UNITED STATES PATENT AND TRADEMARK OFFICE
CERTIFICATE OF CORRECTION

| | | |
|---|---|---|
| PATENT NO. | : 7,023,246 B2 | Page 1 of 1 |
| APPLICATION NO. | : 10/795080 | |
| DATED | : April 4, 2006 | |
| INVENTOR(S) | : Scollo et al. | |

It is certified that error appears in the above-identified patent and that said Letters Patent is hereby corrected as shown below:

Title page insert item --(30) Mar. 5, 2003     (EP) ............... 03425141--

Column 6, Line 63     Delete: "end"
                                Insert: --and--

Signed and Sealed this

Seventeenth Day of October, 2006

JON W. DUDAS
*Director of the United States Patent and Trademark Office*